United States Patent [19]
Beasom

[11] Patent Number: 5,436,189
[45] Date of Patent: Jul. 25, 1995

[54] SELF-ALIGNED CHANNEL STOP FOR TRENCH-ISOLATED ISLAND

[75] Inventor: James D. Beasom, Melbourne Village, Fla.

[73] Assignee: Harris Corporation, Melbourne, Fla.

[21] Appl. No.: 106,160

[22] Filed: Aug. 13, 1993

Related U.S. Application Data

[60] Division of Ser. No. 679,182, Apr. 2, 1991, Pat. No. 5,248,894, which is a continuation of Ser. No. 416,490, Oct. 3, 1989, abandoned.

[51] Int. Cl.$^6$ .............................................. H01L 21/76
[52] U.S. Cl. .......................................... 437/67; 437/63; 437/64; 148/DIG. 50
[58] Field of Search ................. 437/33, 67, 63, 64; 148/DIG. 50

[56] References Cited

U.S. PATENT DOCUMENTS

| | | | |
|---|---|---|---|
| 4,140,558 | 2/1979 | Murphy et al. | 437/67 |
| 4,523,369 | 6/1985 | Nagakubo | 437/67 |
| 4,534,824 | 8/1985 | Chen | 437/63 |
| 4,692,992 | 9/1987 | Hsu | 437/67 |
| 4,824,797 | 4/1989 | Goth | 437/63 |
| 5,206,182 | 4/1993 | Freeman | 437/33 |

FOREIGN PATENT DOCUMENTS 0161838 9/1984 Japan .................................. 437/67

*Primary Examiner*—Brian E. Hearn
*Assistant Examiner*—Trung Dang
*Attorney, Agent, or Firm*—Charles E. Wands

[57] ABSTRACT

A channel stop is self-aligned with a trench sidewall of a trench-isolated semiconductor architecture, so that there is no alignment tolerance between the stop and the trench wall. An initial masking layer, through which the trench pattern is to be formed in a semiconductor island layer, is used as a doping mask for introducing a channel stop dopant into a surface portion of the semiconductor layer where the trench is to be formed. The lateral diffusion of the dopant beneath the oxide and adjacent to the trench aperture defines the eventual size of the channel stop. The semiconductor layer is then anisotropically etched to form a trench to a prescribed depth, usually intersecting the underlying semiconductor substrate. Because the etch goes through only a portion of the channel stop diffusion, leaving that portion which has laterally diffused beneath-the oxide mask, the channel stop is self-aligned with the sidewall of the trench. The trench may be then oxidized and filled with polysilicon material to complete the trench isolation process. The width of the stop is controlled by lateral diffusion, which can be smaller than the width of a line defined by a mask, since that width is the minimum mask width plus twice the lateral diffusion of the layer defined by the mask.

11 Claims, 6 Drawing Sheets

SELF-ALIGNED CHANNEL STOP FOR TRENCH-ISOLATED ISLAND

This is a division of application Ser. No. 679,182, filed Apr. 2, 1991, now U.S. Pat. No. 5,248,894, issued Sep. 28, 1993, which, in turn, is a continuation of application Ser. No. 416,490, filed Oct. 3, 1989, now abandoned.

FIELD OF THE INVENTION

The present invention relates in general to trench-isolated semiconductor devices and is particularly directed to a mechanism for forming a channel stop that is self-aligned with the trench walls.

BACKGROUND OF THE INVENTION

Because of its inherent reduced capacitance and higher integration density properties trench isolation is often used to isolate semiconductor islands within an integrated circuit architecture. In addition to being used with silicon-on-insulator configurations, trench isolation is also commonly employed with PN junction isolation of the bottom or floor of the island, as diagrammatically illustrated in FIG. 1, which shows an N− island 11 atop an support substrate 12. The sides of island 11 are isolated by means of a trench 13, typically filled with an insulator (oxide) layer 14 and conductor (polysilicon) material.

As trench isolation technology has developed it has been increasingly used to isolate thicker islands, such as those employed for high voltage (e.g. in excess of 30 volts) devices. With the relatively large field gradients in such devices there is the possibility of the formation of a parasitic inversion path 17 beneath the surface oxide layer 18 and along the sidewall of the island 11, which electrically connects a device region, such as P type diffusion region 21 formed in the surface of island 11, with the underlying substrate. Such a parasitic path may be caused, for example, by the gating action of the potential applied to polysilicon material 15 together with the voltage of an interconnect line (not shown) which overlies surface oxide layer 18 between region 21 and trench 13, by the action of negative charge on and-/or in the surface and sidewall oxide layers, or by a combination of charge and gate bias. High voltage islands are particularly prone to the problem since they use higher resistivity material, which has a lower inversion threshold voltage than lower resistivity material, to achieve a higher breakdown voltage. In addition, the higher voltages present on the conductors cause the parasitic devices to turn on.

One technique to circumvent the inversion problem is to use a channel stop, which, for a high voltage junction, typically takes the form of a diffusion, such as diffusion region 31 shown in FIG. 2, having the same conductivity type as island 11, surrounding the opposite conductivity diffusion 21. The surface concentration of the channel stop is elevated with respect to that of the island and is made high enough so that it does not invert under worst case conditions. In order not to limit breakdown the channel stop region is spaced apart from region 21, which increases device occupation area and thus reduces integration density.

SUMMARY OF THE INVENTION

In accordance with the present invention, the need to provide a separation region between the trench and a device region within the island, which results in an unwanted increase in occupation area, is obviated by channel stop formation technique through which the stop is self-aligned with the trench sidewall, so that there is no alignment tolerance between the stop and the trench wall. Moreover, the width of the stop is controlled by lateral diffusion, which can be smaller than the width of a line defined by a mask, since that width is the minimum mask width plus twice the lateral diffusion of the layer defined by the mask.

In accordance with the present invention, an initial masking layer, e.g. oxide, through which the trench pattern is to be formed in the semiconductor island layer, is used as a doping mask for introducing a channel stop dopant into a surface portion of the semiconductor layer where the trench is to be formed. The lateral diffusion of the dopant beneath the oxide and adjacent to the trench aperture defines the eventual size of the channel stop, such that its lateral dimension is less than its depth, or vertical dimension, since an inherent characteristic of such lateral diffusion is that the dimension of the lateral diffusion beneath the mask is less than the diffusion depth into the semiconductor layer exposed by the mask aperture. The semiconductor layer is then anisotropically etched to form a trench to a prescribed depth, usually intersecting the underlying semiconductor substrate. Because the etch goes through only a portion of the channel stop diffusion, leaving that portion which has laterally diffused beneath the oxide mask, the channel stop is self-aligned with the sidewall of the trench. The trench may be then oxidized and filled with polysilicon material to complete the trench isolation process.

DETAILED DESCRIPTION

Figure 1:
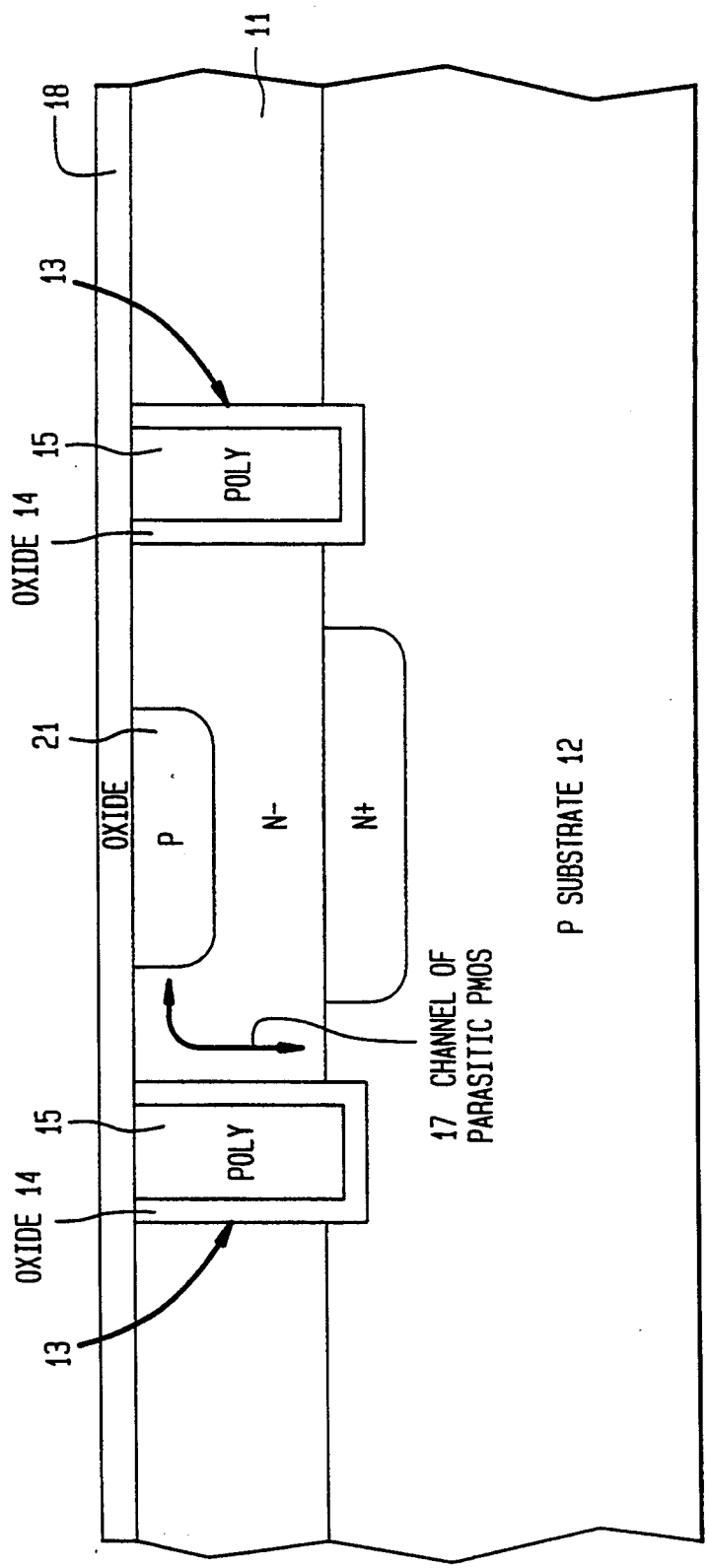
FIG. 1 diagrammatically illustrates PN junction isolation at the bottom of a conventional trench-isolated island.
Figure 2:
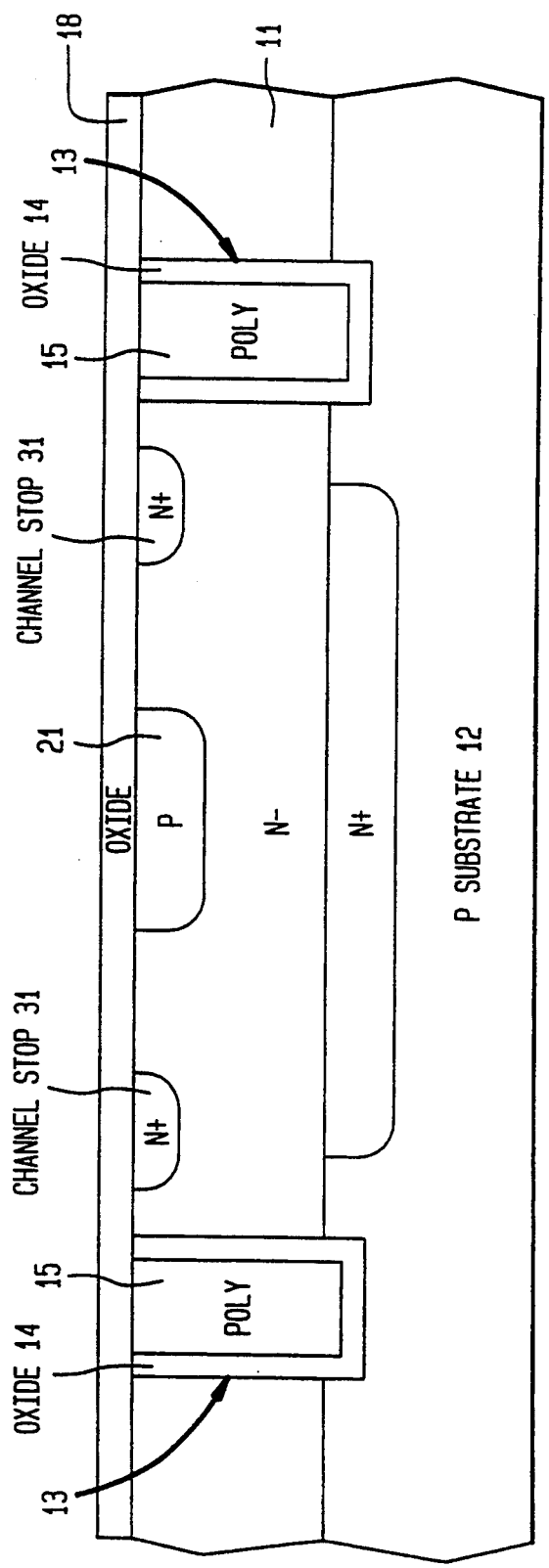
FIG. 2 illustrates a conventional channel stop mechanism for circumventing inversion for a high voltage junction in a trench-isolated island.
Figure 3A:
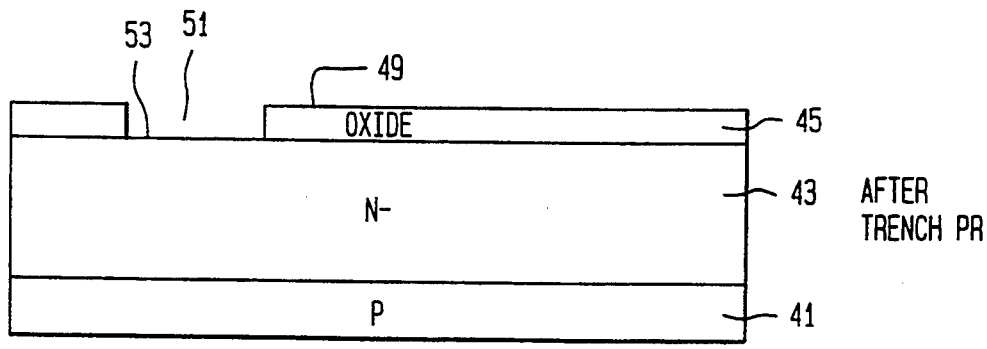
FIGS. 3a–3d diagrammatically illustrate a trench-isolated semiconductor device employing a self-aligned channel stop, in cross-section, at respective stages of the manufacturing process of the present invention.

Referring now to FIGS. 3a–3d, a trench-isolated semiconductor device employing a self-aligned channel stop is diagrammatically illustrated, in cross-section, at respective stages of manufacture. In particular, FIG. 3a shows a semiconductor (e.g. silicon) substrate 41 of a first conductivity type (e.g. P type), having a semiconductor layer 43 of a second conductivity type (e.g. N− type), formed on substrate 41 and having a top surface 45.

Overlying the top surface 45 of semiconductor layer 43 is an insulator layer 49, such as silicon oxide, which is selectively patterned to form one or more apertures 51, exposing respective surface portions 53 of the semiconductor layer 43 for the purpose of defining an etch mask which will delineate the trench-isolated island.

Figure 3B:
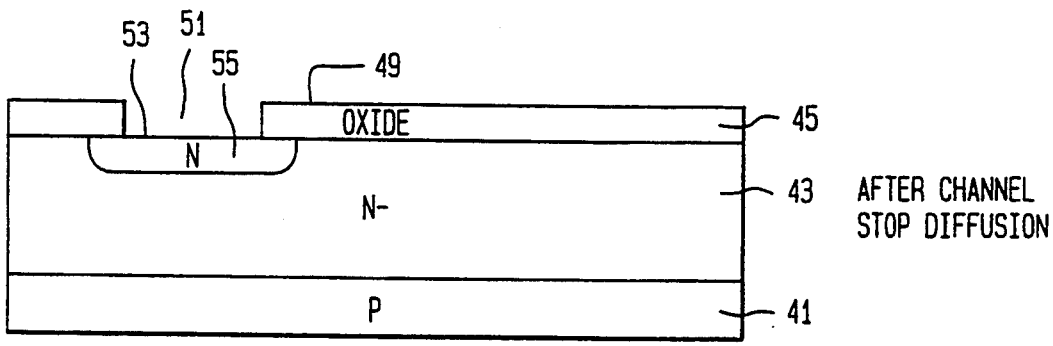

In accordance with the present invention, prior to etching through semiconductor layer 43 to form the trench pattern, a channel stop dopant (an N type impurity such as phosphorous) is introduced (diffused) into semiconductor layer 43 through aperture 51 in insulator layer 49, so as to form a high impurity concentration region 55, which will serve as the source of channel stop regions and extends into the adjacent surface of semiconductor layer 43 beneath insulator layer 49, as shown in FIG. 3b. Region 55 has an impurity concentration greater (N) than that (N−) of semiconductor layer 43, and is sufficiently high that it does not invert under worst case conditions.

Figure 3C:
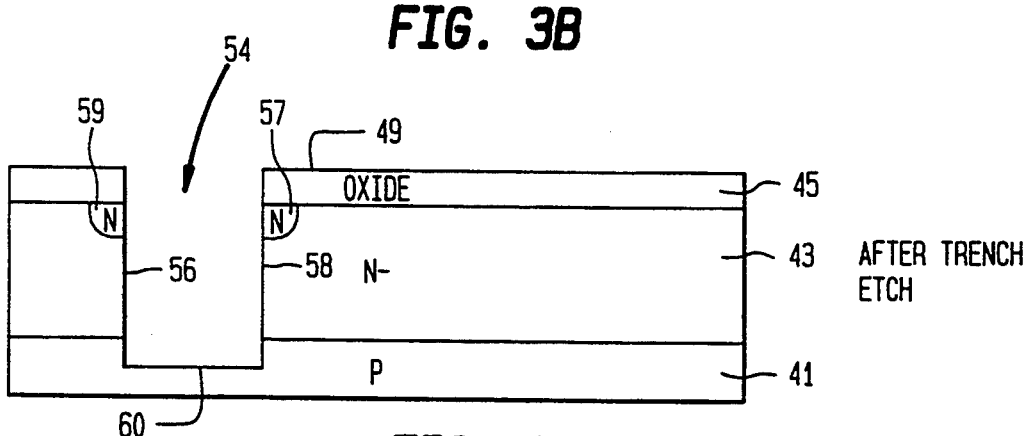

Following the diffusion of high impurity concentration region 55, a trench 54 is formed in semiconductor layer 43 through aperture 51 and region 55. Specifically, using insulator layer 49 as a mask, semiconductor layer 43 is anisotropically etched, for example by a reactive ion etch, down to the substrate 41, as shown in FIG. 3c. Since the trench passes through the channel stop region, leaving region segments 57 and 59 that have diffused into surface regions of layer 43 adjacent to aperture 51, the sidewalls of regions 57 and 59 are inherently self-aligned with the sidewalls 56, 58 of the trench. Thus, channel stop regions 57 and 59 are contiguous with both the top surface 45 and the trench sidewall surfaces 56, 58, having a width set (which is less than its depth, as described above) by lateral diffusion beneath oxide layer 49 so as to occupy minimum area.

Figure 3D:
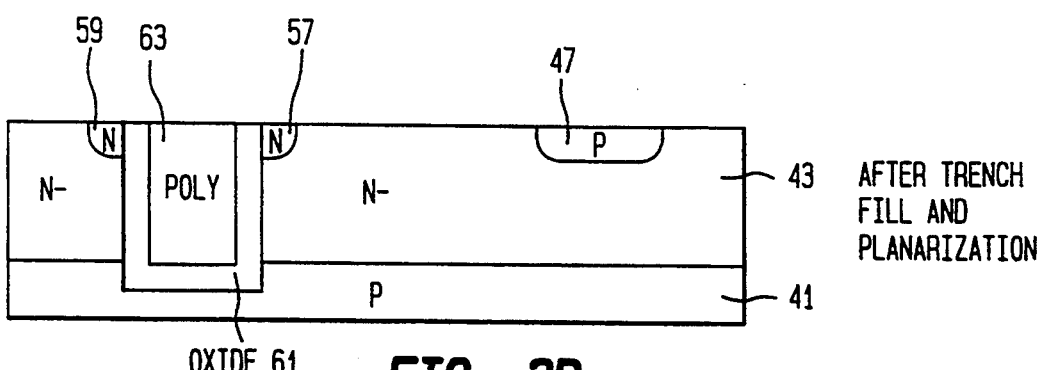

Next, as shown in FIG. 3d, the sidewalls 56, 58 and floor, or bottom 60, of the trench are coated or filled with an insulator layer 61, such as silicon oxide. Where the trench is only partially filled, it may be followed by a layer of conductive material, for example by filling the oxide-coated trench with doped polysilicon 63, up to the surface of semiconductor layer 43. The original mask layer may then be stripped off surface 45, for subsequent processing. Also shown in FIG. 3d is a region 47 of P conductivity type, representative of one or more semiconductor regions that define PN junctions with semiconductor layer 43 and form device regions of one or more prescribed circuit elements that make up the integrated circuit architecture. Region 47 may be formed by conventional processing subsequent to the trench refill.

Figure 4:
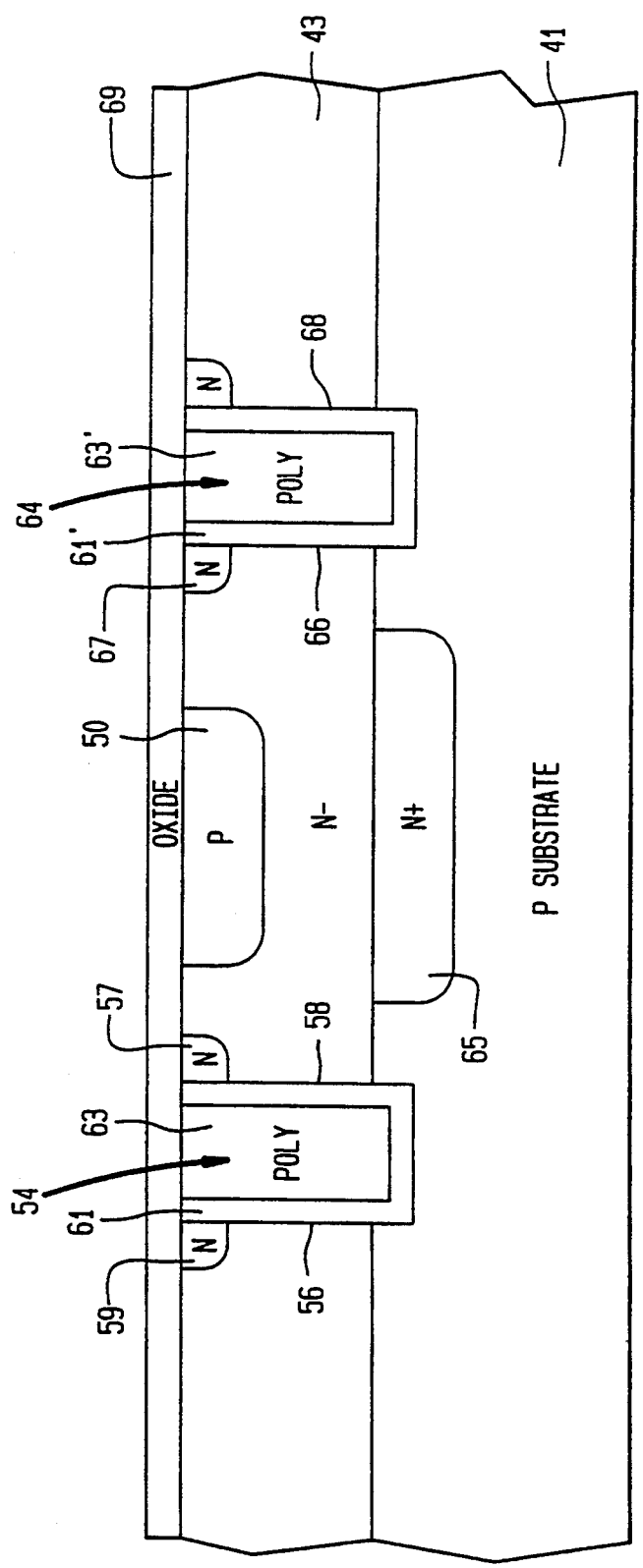
FIG. 4 shows a completed trench-isolated island structure having an underlying N+ region and a pair of channel stop regions that are contiguous with the sidewalls of isolation trenches.

FIG. 4 shows a completed trench-isolated island structure (P substrate 41/N− top layer 43) (absent contacts) having an N+ region 65, underlying P-type region 50 and a pair of channel stop regions 57 and 67 that are contiguous with the sidewalls 56, 58 and 66, 68 of respective trenches 54 and 64 but are spaced-apart from P-type region 50. Trenches 54 and 64 contain a sidewall-contiguous layer of dielectric (oxide) 61, 61′ and polysilicon refill 63, 63′, respectively. The top surface 45 of semiconductor layer 43 is covered with a thick field oxide 69, to minimize breakdown reduction, which may occur when a biased conductor lies over an N to N-high low junction. As can be seen from FIGS. 3d and 4, the manner of forming channel stop regions in accordance with the present invention creates no steps in the surface oxide layer. This absence of steps allows higher resolution lithography to be used and improves interconnect step coverage.

Figure 5:
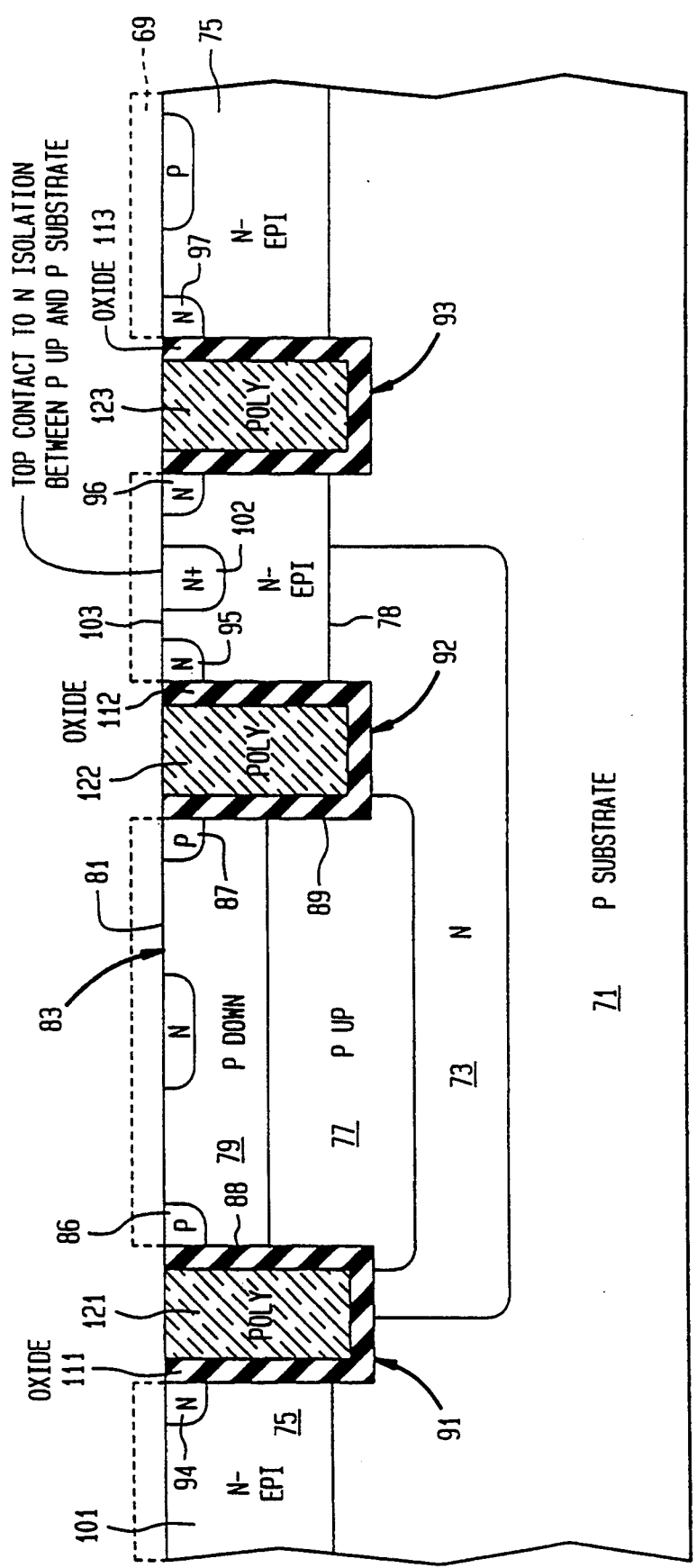
FIG. 5 is a cross-sectional side view of an arrangement of P and N islands trench-isolated on an underlying P substrate having self-aligned channel stop regions.
Figure 6:
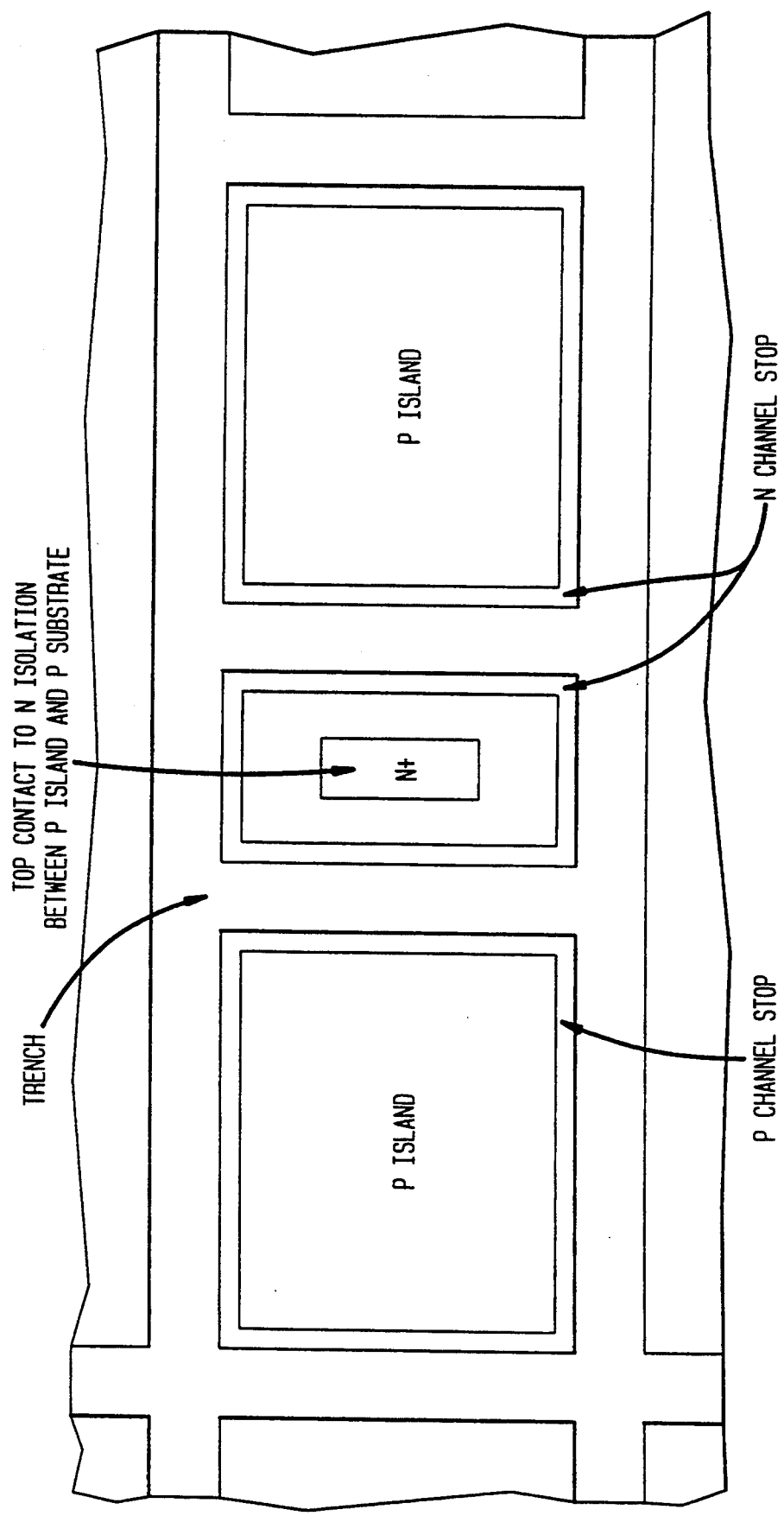
FIG. 6 is a top view of the arrangement of P and N islands trench-isolated on an underlying P substrate having self-aligned channel stop regions as shown in FIG. 5.

FIGS. 5 and 6 diagrammatically illustrate the application of the present invention to the case where complementary conductivity type islands (both P and N type) are trench-isolated within the same semiconductor wafer. More particularly. FIG. 5 is a cross-sectional side view and FIG. 6 is a top view of an arrangement of P and N islands trench-isolated on an underlying P substrate 71, which contains a buried N separation layer 73 where the P island is to be formed. Manufacture of the illustrated complementary trench-isolated structure is initiated by providing a semiconductor substrate 71 (P type in the present example), in which N type isolation region 73 has been diffused where a surface P type island is to be formed. Following diffusion of region 73, a shallow P type surface diffusion is formed in region 73 to serve a source of P dopant impurities during subsequent epitaxial formation of a top (N−) semiconductor layer 75. During epitaxial growth of layer 75 these P type impurities diffuse up into layer 75 to form P type region 77. After layer 75 has been formed, an additional P type region 79 is selectively down-diffused through the top surface 81 of layer 75, so as to intersect region 77 and thereby define a P type island region 83 that is isolated from P type substrate by separation region 73. In some cases, an alternative approach would be to omit the preliminary formation of up diffusion region 77 and use only a down-diffusion to complete the island 83. Both techniques are conventional.

Since epitaxial layer 75 contains both N− and P type material that are to be trench-isolated both N and P type channel stop regions are to be formed. The self-alignment mechanism described above with reference to FIGS. 3a-3d is carried out for both island types. To define the location of each type of channel stop region (P and N type) an extra oversize mask (an ion-implant photoresist mask) may be formed to overlie epitaxial layer 75, so as to overlap the trench and limit the N channel stop, to only those trenches that border N type islands. The P channel stop regions are patterned in a similar manner. In the structure illustrated in FIG. 5, it will be noted that P type channel stop regions 86 and 87, within P type island 83, are self-aligned with respective sidewalls 88 and 89 of trenches 91 and 92, while the opposite sidewalls of trenches 91 and 92 are contiguous with N type channel stops for islands 101 and 103. For complementary channel stops on opposite walls of a trench, respective P and N masks may extend from the neighborhood of the center of the trench laterally to overlap the edge of the trench pattern where that particular type channel stop region is to be formed.

Although there is some overlap of the mask aperture about the center of the trench, this overlap region is removed during trench etch so that, in effect, the overlap is a don't care region. Consequently, counterdoping of the first dopant by the second is unnecessary. Alternatively, one of the channel dopants, e.g. N type, may be initially non-selectively introduced into all surface regions where channel stops (regardless of final conductivity type) are desired. Then a separate mask may be formed to selectively counterdope these regions where opposite conductivity type (P type in the present example) channel stops are desired, leaving the N channel stops, as is.

In the embodiment of FIGS. 5 and 6, N− type island 103 is trench-isolated by dielectric-coated/polysilicon-filled trenches 92 and 93, with which channel stop region pairs 87, 95 and 96, 97 are self-aligned in the manner described above. Dielectric (oxide) is shown at 111, 112, 113, while poly refill is shown at 121, 122, 123. An additional high impurity N+ contact region 102 is diffused into island 103, in order to supply a prescribed bias through island 103 to underlying N type separation region 73, which is contiguous with island 103 at surface 78 of underlying substrate 71.

As will be appreciated from the foregoing description of the channel stop formation technique according to the present invention, through which the channel stop is self-aligned with the trench sidewall, the undesirable provision of a separation region or spacing between the trench and a device region within a trench-isolated island, which results in an unwanted increase in occupation area, is effectively obviated, so that there is no alignment tolerance between the channel stop and the trench wall. Moreover, the width of the stop is controlled by lateral diffusion, which can be smaller than the width of a line defined by a mask, since that width is the minimum mask width plus twice-the lateral diffusion of the layer defined by the mask.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. A method of manufacturing a semiconductor device comprising the steps of:
    (a) providing a semiconductor substrate having a first semiconductor portion of a first conductivity type, a second semiconductor portion of a second conductivity type, opposite to said first conductivity type, spaced apart from said first semiconductor portion by a separation surface portion therebetween, and a third semiconductor portion of said second conductivity type, formed beneath said first semiconductor portion;
    (b) forming first and second semiconductor regions of said first and second conductivity types, respectively, in surface portions of said first and second semiconductor portions of said substrate, said first semiconductor region having an impurity concentration greater than that of said first semiconductor portion and said second semiconductor region having an impurity concentration greater than that of said second semiconductor portion and being spaced-apart from said third semiconductor portion of said second conductivity type;
    (c) forming a trench through said separation surface portion of said semiconductor substrate, such that said trench intersects and extends through said first and second semiconductor portions, so that sidewalls of said trench touch said first and second semiconductor regions and said first and second portions of said substrate; and
    (d) forming a layer of insulator material disposed along sidewalls of said trench.

2. A method according to claim 1, wherein step (a) further includes forming third and fourth semiconductor regions in said first and second portions of said semiconductor substrate, so as to be spaced apart from said first and second semiconductor regions formed in step (b).

3. A method according to claim 1, further including the step (f) of forming conductive material on said layer of insulator material in said trench.

4. A method according to claim 1, wherein step (c) comprises forming said trench such that said first semiconductor region has a first dimension which extends laterally in a surface portion of said first semiconductor portion of said substrate, and a second dimension, which extends vertically along a sidewall of said trench, such that the first dimension of said first semiconductor region is less than the second dimension of said first semiconductor region, and such that said second semiconductor region has a first dimension which extends laterally in a surface portion of said second semiconductor portion of said substrate, and a second dimension, which extends vertically along a sidewall of said trench, so that the first dimension of said second semiconductor region is less than the second dimension of said second semiconductor region.

5. A method of manufacturing a semiconductor device comprising the steps of:
    (a) providing a semiconductor substrate having a first semiconductor layer containing a first portion of semiconductor material of a first conductivity type and a second portion of semiconductor material of a second conductivity type, opposite to said first conductivity type, and a second semiconductor layer containing a third portion of semiconductor material of said second conductivity type that overlies and touches said first portion of semiconductor material of said first layer, and a fourth portion of semiconductor material of said first conductivity type that overlies and touches said second portion of semiconductor material of said first layer;
    (b) forming a first semiconductor region of said second conductivity type in a surface portion of said third portion of said second semiconductor layer, said first semiconductor region having an impurity concentration greater than that of said third portion of semiconductor material of said second semiconductor layer and being spaced-apart from said second portion of semiconductor material of said second conductivity type;
    (c) forming a second semiconductor region of said first conductivity type in a surface portion of said fourth portion of said second semiconductor layer, said second semiconductor region having an impurity concentration greater than that of said fourth portion of semiconductor material of said second semiconductor layer;
    (d) forming first and second trenches through said second semiconductor layer, so that sidewalls of said first and second trenches touch said first and second semiconductor regions, respectively, such that said first semiconductor region has a first dimension which extends laterally in said portion of said third semiconductor layer, and a second dimension which extends vertically along the sidewall of said first trench, such that said first dimension of said first semiconductor region is less than the second dimension of said first semiconductor region, and such that said second semiconductor region has a first dimension which extends laterally in said portion of said fourth semiconductor layer, and a second dimension which extends vertically along the sidewall of said second trench, such that said first dimension of said second semiconductor region is less than the second dimension of said second semiconductor region; and (e) forming insulator material along sidewalls of said first and second trenches.

6. A method according to claim 5, further including the step (f) of forming conductive material on insulator material that has been formed along sidewalls of said first and second trenches in step (e).

7. A method according to claim 5, wherein said third portion of semiconductor material of said second conductivity type is spaced apart from said fourth portion of semiconductor material of said first conductivity type by a first separation portion through which said first trench is formed in step (d), and wherein a third semiconductor region of said second conductivity type is formed in another surface portion of said third portion of semiconductor material and extends into adjacent semiconductor material of said third portion of said second semiconductor layer, said third semiconductor region having an impurity concentration greater than that of said third portion of semiconductor material of said second semiconductor layer and being spaced-apart from said second portion of semiconductor material of said second conductivity type, such that said second trench formed in step (d) has its sidewall touching said third semiconductor region.

8. A method of manufacturing a semiconductor device comprising the steps of:
  (a) providing a semiconductor substrate having a first semiconductor layer containing a first portion of semiconductor material of a first conductivity type and a second portion of semiconductor material of a second conductivity type, opposite to said first conductivity type, and a second semiconductor layer containing a third portion of semiconductor material of said second conductivity type that overlies and touches said first portion of semiconductor material of said first layer, and a fourth portion of semiconductor material of said first conductivity type that overlies and touches said second portion of semiconductor material of said first layer and is spaced apart from said third portion of semiconductor material of said second conductivity type;
  (b) forming a first semiconductor region of said second conductivity type in a surface portion of said third portion of said second semiconductor layer, said first semiconductor region having an impurity concentration greater than that of said third portion of semiconductor material of said second semiconductor layer;
  (c) forming a second semiconductor region of said first conductivity type in a surface portion of said fourth portion of said second semiconductor layer, said second semiconductor region having an impurity concentration greater than that of said fourth portion of semiconductor material of said second semiconductor layer;
  (d) forming a third semiconductor region of said second conductivity type in another surface portion of said third portion of said semiconductor material of said semiconductor layer and extending into adjacent semiconductor material of said third portion of said semiconductor material of said second semiconductor layer, said third semiconductor region having an impurity concentration greater than that of said third portion of said semiconductor material of said second semiconductor layer, and such that said second portion of semiconductor material of said first semiconductor layer underlies and touches a prescribed region of said third portion of semiconductor material of said second semiconductor layer;
  (e) forming first and second trenches through said second semiconductor layer to said first semiconductor layer, such that sidewalls of said first and second trenches touch said first and second semiconductor regions, respectively, and such that said second trench has its sidewall touch said third semiconductor region;
  (f) forming insulator material along sidewalls of said first and second trenches; and
  (g) forming an ohmic contact region of said second conductivity type in a further surface portion of said third portion of said second semiconductor layer.

9. A method according to claim 8, wherein step (e) comprises forming said first and second trenches such that said first semiconductor region has a first dimension which extends laterally in said first portion of said third portion of said second semiconductor layer, and a second dimension which extends vertically along the sidewall of said first trench, such that said first dimension of said first semiconductor region is less than the second dimension of said first semiconductor region, and such that said second semiconductor region has a first dimension which extends laterally in said second surface portion of said fourth portion of said second semiconductor layer, and a second dimension which extends vertically along the sidewall of said second trench, such that said first dimension of said second semiconductor region is less than the second dimension of said second semiconductor region.

10. A method of manufacturing a semiconductor device comprising the steps of:
  (a) providing a semiconductor substrate having a first semiconductor layer of a first conductivity type, and a second semiconductor layer of a second conductivity type, opposite to said first conductivity type, formed on said first semiconductor layer and having a first surface;
  (b) forming a first semiconductor region of said second conductivity type in a first surface position of said first surface of said second semiconductor layer surrounding and being spaced apart from a second surface portion of said first surface of said second semiconductor layer by a third surface portion of said first surface of said second semiconductor layer therebetween, while being spaced apart from said first semiconductor layer and having an impurity concentration greater than that of said second semiconductor layer;
  (c) forming a trench through said first semiconductor region and said second semiconductor layer to said first semiconductor layer, so that said trench surrounds said second and third surface portions of said first surface of said second semiconductor layer, and has a sidewall touching said first semiconductor region, said trench dividing said first semiconductor region into a first semiconductor portion adjacent to said third surface portion of said first surface of said second semiconductor layer and into a second semiconductor portion, separated from said third surface portion of said first surface of said second semiconductor layer by said trench, such that said first semiconductor portion has a first dimension which extends laterally into said third surface portion of said first surface of said second semiconductor layer, and a second dimension which extends vertically along said sidewall of said trench, such that said first dimension is less than said second dimension;

(d) forming a first layer of insulator material along said sidewall of said trench and extending through said second semiconductor layer, and forming conductive material on said first layer of insulator material along said sidewall of said trench; and (e) forming a second semiconductor region of said first conductivity type in said second surface portion of said first surface of said second semiconductor layer.

11. A method of manufacturing a semiconductor device comprising the steps of:

(a) providing a semiconductor substrate having a first semiconductor layer of a first conductivity type, and a second semiconductor layer of a second conductivity type, opposite to said first conductivity type, formed on said first semiconductor layer and having a first surface;

(b) forming a first semiconductor region of said second conductivity type in a first surface position of said first surface of said second semiconductor layer surrounding and being spaced apart from a second surface portion of said first surface of said second semiconductor layer by a third surface portion of said first surface of said second semiconductor layer therebetween, while being spaced apart from said first semiconductor layer and having an impurity concentration greater than that of said second semiconductor layer;

(c) forming a trench through said first semiconductor region and said second semiconductor layer to said first semiconductor layer, so that said trench surrounds said second and third surface portions of said first surface of said second semiconductor layer, and has a sidewall touching said first semiconductor region, said trench dividing said first semiconductor region into a first semiconductor portion adjacent to said third surface portion of said first surface of said second semiconductor layer and into a second semiconductor portion, separated from said third surface portion of said first surface of said second semiconductor layer by said trench, such that said first semiconductor portion has a first dimension which extends laterally into said third surface portion of said first surface of said second semiconductor layer, and a second dimension which extends vertically along said sidewall of said trench, such that said first dimension is less than said second dimension;

(d) forming a first layer of insulator material along said sidewall of said trench and extending through said second semiconductor layer; and (e) forming a second semiconductor region of said first conductivity type in said second surface portion of said first surface of said second semiconductor layer; and wherein step (b) comprises selectively forming a masking layer on said first surface of said semiconductor layer, said masking layer having an aperture overlying and exposing only a portion of said first surface portion of said first surface of said semiconductor layer in which said first semiconductor region is to be formed in step (c), and introducing impurities of said second conductivity type through said masking layer aperture into said second semiconductor, so that said impurities diffuse horizontally along said third surface portion of said first surface of said second semiconductor layer beneath said masking layer and vertically into said second semiconductor layer, thereby forming said first semiconductor region of said second conductivity type in said first surface portion of said first surface of said second semiconductor layer, and wherein step (c) comprises using said masking layer aperture to define a lateral extent of said trench through first semiconductor region and said second semiconductor layer to said first semiconductor layer, so that said sidewall of said trench touches that portion of said first semiconductor region beneath said masking layer.

* * * * *